United States Patent [19]

Adachi et al.

[11] Patent Number: 5,263,247

[45] Date of Patent: Nov. 23, 1993

[54] METHOD OF FASTENING A BUSBAR TO A LARGE-CURRENT PRINTED CIRCUIT BOARD

[75] Inventors: Einosuke Adachi; Yasumichi Hatanaka; Hiroyuki Nakajima, all of Amagasaki; Satoru Hayashi, Nagoya, all of Japan

[73] Assignee: Mitsubishi Denki Kabushiki Kaisha, Tokyo, Japan

[21] Appl. No.: 924,142

[22] Filed: Aug. 3, 1992

[30] Foreign Application Priority Data

Oct. 23, 1991 [JP] Japan .................................. 3-275146

[51] Int. Cl.$^5$ ............................................. H01R 9/09
[52] U.S. Cl. ...................................... 29/845; 25/525.2
[58] Field of Search ..................... 29/525.2, 512, 843, 29/844, 845, 509; 411/34, 38, 69, 501

[56] References Cited

U.S. PATENT DOCUMENTS

| | | | |
|---|---|---|---|
| 2,779,998 | 2/1957 | Bailey | 29/843 |
| 4,086,840 | 5/1978 | Kurlander | 411/34 |
| 5,065,283 | 11/1991 | Adachi et al. | 361/407 |

FOREIGN PATENT DOCUMENTS 0241346  9/1989  Japan .................................. 29/525.2

Primary Examiner—Mark Rosenbaum
Assistant Examiner—Kenneth J. Hansen
Attorney, Agent, or Firm—Wolf, Greenfield & Sacks

[57] ABSTRACT

A method of preparing a large-current printed circuit board comprises inserting a fastener with a bottom flange in a through-hole formed in a printed circuit board so that the bottom flange is engaged with a surface of the printed circuit board, putting a washer having substantially the same outer diameter so the flange around the fastener at the other surface of the board, forming a radial extension at the outer side of the washer by caulking the fastener, whereby the fastener is fixed to the printed circuit board by means of the radial extension and the bottom flange wherein the washer is interposed between the radial extension and the printed circuit board.

4 Claims, 4 Drawing Sheets

FIG. 8A (PRIOR ART)
FIG. 8B (PRIOR ART)
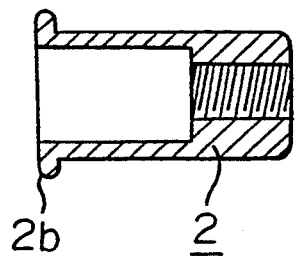
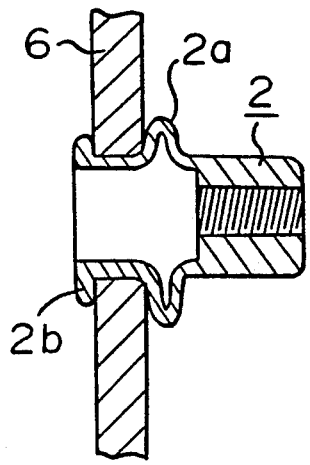
FIGURE 9 (PRIOR ART)
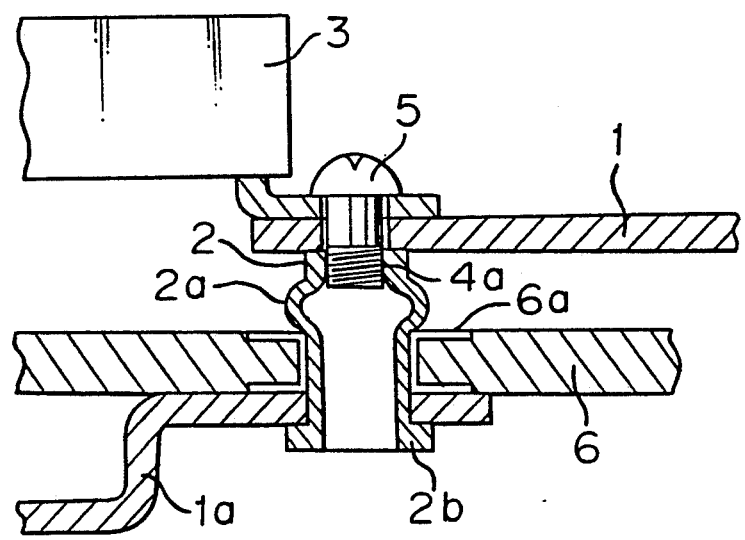

METHOD OF FASTENING A BUSBAR TO A LARGE-CURRENT PRINTED CIRCUIT BOARD

BACKGROUND OF THE INVENTION

1. Field of the Invention

The present invention relates to a method of preparing a large-current printed circuit board. For instance, it relates to a method of preparing a large-current printed circuit board device in which a busbar is provided at a printed circuit board so as to form a large current electric circuit.

2. Discussion of Background

FIG. 7 is a cross-sectional view showing a conventional large-current circuit board, e.g. a printed circuit board device in which a busbar is used so as to form a large current electric circuit, described in, for instance, Japanese Unexamined Patent Publication No. 159787/1990. In FIG. 7, reference numeral 1 designates a busbar which is made of a slender copper plate of 12 mm wide and 1.2 mm thick, for instance. Numeral 2 designates a fastener made of an electric conductive material such as copper, brass or the like. Numeral 4 designates a lead terminal fastened to a circuit element 3 by means of a screw, the lead terminal having a threaded hole 4a at a portion near its free end. Numeral 5 designates a screw and numeral 6 designates a printed circuit board.

First, a process of preparing the large-current printed circuit board having the construction described above, will be described. A through-hole is formed at a predetermined position in the printed circuit board 6 so that the diameter of the through-hole is about 0.1 mm-0.5 mm larger than the outer diameter of the fastener 2. Then, the fastener 2 is inserted to the through-hole so that a bottom flange formed at its one end is engaged with a surface of the printed circuit board 6. A caulking operation is conducted to the fastener 2 with use of a tool for exclusive use so that a radial extension 2a is formed at an intermediate of the fastener 2, whereby the fastener is fixed to the printed circuit board 6. Then, an insertion hole of the busbar 1 is aligned to the bore of the fastener 2, and the screw 5 is engaged with the threaded hole 4a of the lead terminal 4, whereby the busbar is fixed to the circuit element 3 to thereby form a large-current printed circuit board to which the printed circuit board 6 is attached.

The detailed description will be made as to the fastener 2. FIGS. 8a and 8b are respectively cross-sectional views showing a conventional fastener 2 wherein FIG. 8a shows such fastener having a portion 2a before a caulking operation and FIG. 8b shows the fastener in a state that the fastener is fastened to a printed circuit board 6. The fastener 2 is made of a metallic material and comprises a cylindrical body having an uniform outer diameter and a bottom flange 2b at an end of the cylindrical body, the outer diameter of the flange 2b being larger than the outer diameter of the cylindrical body. The wall thickness of the cylindrical body is formed so that it is stepwisely reduced from the side of the flange 2b. Namely, the wall thickness of the cylindrical body near the flange is thinner, and the wall thickness remote from the flange 2b is thicker.

The fastener 2 is inserted into a through-hole formed in the printed circuit board 6 so that the flange 2b is engaged with a surface of the board 6. Then, both ends of the fastener 2 is compressed toward its center in the axial direction by using a tool for exclusive use, whereby a portion having a thinner wall thickness is expanded outwardly to thereby form a radial extension or a caulking portion 2a so that the fastener is fixed to the printed circuit board 6. Thus, in the conventional large-current printed circuit board, the fastener 2 is fixed to the printed circuit board 6 by means of the radial extension 2a and the flange 2b, and a busbar 1 and a circuit element 3 are connected to the fastener 2 with use of a screw, whereby each of the parts is strongly and mechanically connected to the printed circuit board 6.

FIG. 9 shows in cross-section another conventional large-current printed circuit board. In FIG. 9, a through-hole and a land portion 6a are formed in a printed circuit board 6a in which a fastener 2 is inserted. An electric circuit is printed on the board so that the circuit is suitably connected to the land portion 6a. A busbar 1 and a circuit element 3 are fixed to the fastener 2 by engaging a screw 5 with a threaded hole 4a which is formed at the upper part of the fastener 2. Further, a busbar 1 is interposed between the lower surface of the printed circuit board 6 and the flange 2b of the fastener 2, which is formed at the lower portion of it.

In the conventional method of preparing a large-current printed circuit board, there is a problem of a change of the material for the circuit board by aging when the printed circuit board is continuously used for a long time. The conventional printed circuit board 6 is mainly made of a glass epoxy resin. Accordingly, when a large current is continuously supplied for a long time, there causes heat deterioration in the entire or a local portion of the printed circuit board due to a temperature rise at a current conducting portion to thereby cause problems of reduction of thickness of the board due to the deterioration of the epoxy resin and reduction of the creeping characteristic. These result in the weakening of the fitting strength of the fastener 2 to the printed circuit board 6 and the delamination or the measling of the printed circuit board at a portion near the fixing part. Further, the resistance of contact between the busbar 1 or the busbar 1a to the fastener 2 becomes high because the fitting strength becomes weak, with the result of causing electric and thermal defects. Further, in case that a printed circuit is formed on the printed circuit board 6, the resistance of contact between the land portion 6a and the fastener 2 becomes high to thereby cause electric and thermal defects. Further, when the fastener 2 is inserted in the printed circuit board 6 and the both ends of the fastener 2 is compressed toward the center in the axial direction to thereby fix the fastener 2 to the printed circuit board 6 by caulking, a portion having a thinner wall thickness of the fastener 2 is expanded outwardly in such a manner that an excessive force is locally applied to corner portions of the through-hole and the land portion 6a so that parts of the through-hole and the land portion 6a may be broken. In addition, since the radial extension 2a has a curved shape, the surface of contact of the radial extension 2a is not always flat and the fitting force to the flange 2b is uneven, whereby the printed circuit board 6 may be curved after the caulking operation.

SUMMARY OF THE INVENTION

It is an object of the present invention to provide a method of preparing a large-current printed circuit board which minimizes the weakening of the fitting strength of the fastener to the printed circuit board, delamination or measling in the printed circuit board near the fitting portion and a change of the resistance of contact even when the thermal deterioration of the material for the printed circuit board progresses due to a continuous use for a long time.

Further, it is an object of the present invention to provide a method of preparing a large-current printed circuit board capable of preventing the bending of the printed circuit board when a fastener is fixed to the printed circuit board by caulking.

According to a first invention, there is provided a method of preparing a large-current printed circuit board which comprises:

inserting a fastener with a bottom flange in a through-hole formed in a printed circuit board so that the bottom flange is engaged with a surface of the printed circuit board, putting a washer having substantially the same outer diameter as the flange around the fastener at the other surface of the board, forming a radial extension at the outer side of the washer by caulking the fastener, whereby the fastener is fixed to the printed circuit board by means of the radial extension and the bottom flange wherein the washer is interposed between the radial extension and the printed circuit board.

According to a second invention, there is provided a method of preparing a large-current printed circuit board which comprises:

inserting a fastener with a bottom flange in through-holes formed in a printed circuit board and a busbar so that the bottom flange is engaged with a surface of the printed circuit board, putting a washer having substantially the same outer diameter as the flange around the fastener at the other surface of the board, forming a radial extension at the outer side of the washer by caulking the fastener, whereby the fastener is fixed to the printed circuit board and the busbar by means of the radial extension and the bottom flange wherein the washer is interposed between the radial extension and the printed circuit board.

In the first and second inventions, the washer may be a spring washer.

According to a third invention, there is provided a method of preparing a large-current printed circuit board which comprises:

putting a cream solder by a printing technique at least a part of a land portion of a printed circuit board, inserting a fastener with a bottom flange in a through-hole formed in the printed circuit board so that the bottom flange is engaged with a surface of the board, forming a radial extension at the other surface of the printed board by caulking the fastener, melting the cream solders, whereby the fastener is fixed to the printed circuit board.

According to a fourth invention, there is provided a method of preparing a large-current printed circuit board which comprises:

putting a cream solder by a printing technique at a portion of a surface of a busbar, the portion being to be brought into contact with a bottom flange formed at a fastener, putting another cream solder by a printing technique at a portion facing a land portion of a printed circuit board, inserting the fastener in through-holes formed in the printed circuit and the busbar so that the bottom flange of the fastener is engaged with a surface of the printed circuit, forming a radial extension at the other surface of the printed circuit board by caulking the fastener, and melting the cream solders, whereby the fastener is fixed to the printed circuit board and the busbar.

According to a fifth invention, there is provided a method of preparing a large-current printed circuit board which comprises:

putting a cream solder by a printing technique at a portion of a surface of a busbar, the portion being to be brought into contact with a radial extension formed at a fastener, putting another cream solder by a printing technique at a portion facing a land portion of a printed circuit board, inserting the fastener in through-holes formed in the printed circuit board and the busbar so that the bottom flange is engaged with a surface of the printed circuit board, forming the radial extension at the outer side of the busbar by caulking the fastener, and melting the cream solders, whereby the fastener is fixed to the printed circuit board and the busbar.

According to a sixth invention, there is provided a method of preparing a large-current printed circuit board which comprises:

forming a solder layer by plating at an outer surface of a fastener with a bottom flange, inserting the fastener in a through-hole formed in a printed circuit board so that the bottom flange of the fastener is engaged with a surface of the printed circuit board, forming a radial extension at the outer side of the printed circuit board by caulking the fastener, soldering the fastener and a land portion of the printed circuit board, whereby the fastener is fixed to the printed circuit board.

BRIEF DESCRIPTION OF DRAWINGS

A more complete appreciation of the invention and many of the attendant advantages thereof will be readily obtained as the same becomes better understood by reference to the following detailed description when considered in connection with the accompanying drawings, wherein:

FIGS. 8a and 8b are respectively cross-sectional views of a fastener used for a conventional printed circuit board device; and FIG. 9 a cross-sectional view partly broken showing another conventional printed circuit board device in which a busbar is used.

DETAILED DESCRIPTION OF THE PREFERRED EMBODIMENTS

Figure 1:
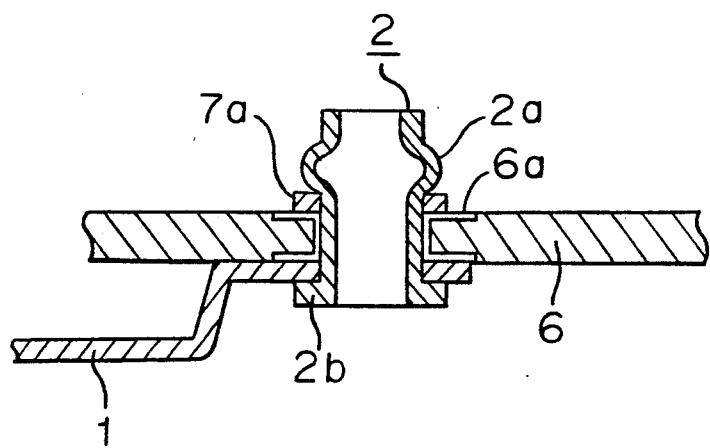
FIG. 1 is a cross-sectional view partly broken of an embodiment of the method of preparing a large-current printed circuit according to the present invention.

Referring to the drawings wherein the same reference numerals designate the same or corresponding parts, and more particularly to FIG. 1 thereof, there is shown a large-current printed circuit board obtained by first example of the present invention.

EXAMPLE 1

In FIG. 1, reference numeral 7a designates a washer which is made of the same material such as stainless steel or iron as the flange 2b. Also, it has the same outer configuration as the flange 2b.

In this example, the fastener 2 is inserted in through holes formed in the busbar 1 and the printed circuit board 6 so that the flange 2b of the fastener 2 is engaged with a surface of the busbar 1. Then, the washer 7a having substantially the same outer diameter as the flange 2b is put on the fastener 2 at the opposite side of the flange 2b with respect to the printed circuit board 6 and the busbar 1. The fastener 2 is caulked from the outer side of the washer 7a with use of a tool for exclusive use so that a radial extension or a caulking portion 2a is formed in the fastener 2 at the outer side of the washer 7a, whereby the fastener 2 is fixed to the busbar 1 and the printed circuit board 6 by means of the radial extension 2a and the flange 2b between which the washer 7a is interposed.

According to the above-mentioned method, since the outer configuration of the flange 2b is the same as that of the washer 7a, the surface area of contact of the both elements is parallel to each other, and a uniform pressure is applied to the printed circuit board 6 when a caulking operation for fixing the fastener is conducted. Accordingly, there is avoidable a possibility of destroying a part of the through-hole and/or the land portion 6a by the outward expansion of the thinner wall portion of the fastener 2, i.e. a force is applied to a corner portion of the through hole and/or the land portion 6a, when the fastener 2 is fixed to the printed circuit board. Further, since the shape of the radial extension 2a is in a curved shape, there is no difference of fitting strength between the flange 2b and the washer 7a because the contacting surfaces are flat, with the result that there is no danger of causing a curve in the printed circuit board 6 after the caulking.

EXAMPLE 2

Figure 2:
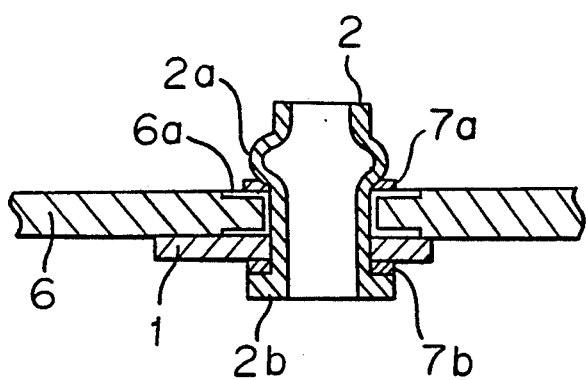
FIG. 2 is a cross-sectional view partly broken of a second embodiment of the method of preparing a large-current printed circuit board according to the present invention.

The second example of the present invention will be described with reference to FIG. 2. In the second example, a spring washer 7b having the same outer configuration and thickness as the washer 7a is put on the fastener at the side of the flange 2b. Then, the radial extension 2a is formed in the fastener 2 at the outer side of the washer 7a so that the fastener 2 is fixed to the printed circuit board 6 together with the busbar 1. The spring washer 7b is made of a material such as iron or stainless steel and is formed in a form of spring. Accordingly, even when there occur problems of thermal deterioration whereby the thickness of the printed circuit board is reduced due to the reduction of the weight of epoxy resin and the reduction of the creeping characteristic, the satisfactory spring function of the spring washer 7b is obtainable and a sufficient strength of connection between the fastener and the printed circuit board 6 can be maintained.

EXAMPLE 3

Figure 3:
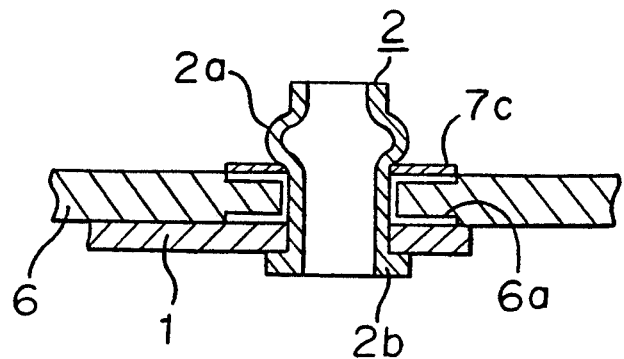
FIG. 3 is a cross-sectional view partly broken of a third embodiment of the present invention.

The third example of the present invention will be described with reference to FIG. 3. In this example, a cream solder 7c is put by printing at at least a part of the land portion 6a of the printed circuit board 6 when an electric circuit is formed on it. For instance, the cream solder 7c is put by printing on the circuit board so as to be in agreement with the diameter of the land portion 6a, and then, the radial extension or caulking portion 2a is formed in the fastener 2 at the outer side of the cream solder 7c.

In the ordinary method of preparing the printed circuit board, a so-called reflow soldering is carried out in a soldering step when an electronic device is mounted. For instance, the fastener 2 and the land portion 6a are formed integrally by heating the cream solder 7c at a temperature of more than 200° C. in the reflow soldering step. In this example, a problem of the reduction of the thickness of the printed circuit board 6 due to thermal deterioration or another defect can be prevented because the fastener 2 and the land portion 6a are integrally formed by the soldering operation.

Figure 7:
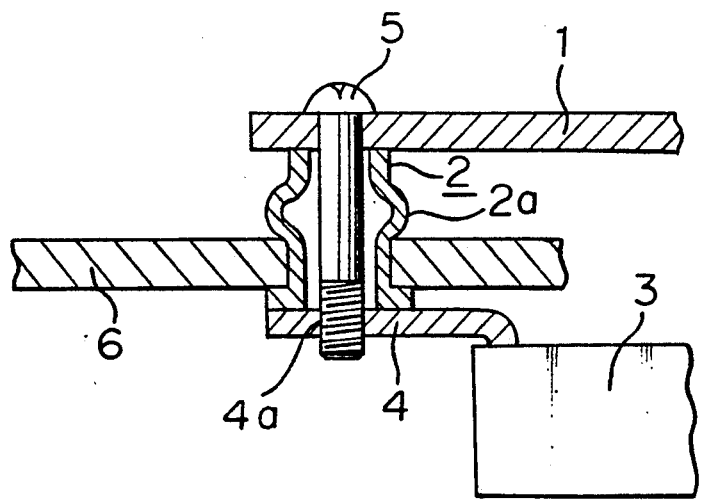
FIG. 7 is a cross-sectional view partly broken showing a conventional large-current printed circuit board with a busbar.

In the above-mentioned Examples 2 and 3, description has been made as to the busbar 1 fixed between the radial extension or caulking portion 2a of the fastener 2 and the flange 2b. However, the busbar 1 may be positioned outside the radial extension 2a when the present invention is applied to the conventional method shown in FIG. 7.

EXAMPLE 4

Figure 4:
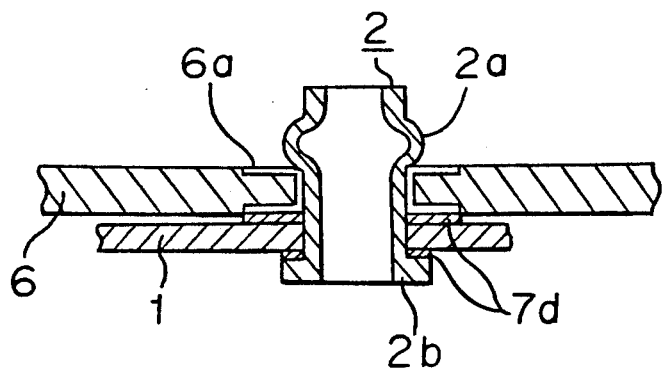
FIG. 4 is a cross-sectional view partly broken of a fourth embodiment of the present invention.

The fourth example of the present invention will be described with reference to FIG. 4. In this example, a cream solder 7d is put by printing on a surface of the busbar at a portion around a through-hole, with which the flange 2b of the fastener 2 is brought to contact. Further, another cream solder 7d is placed by printing on the other surface of the busbar so as to face the land portion 6a. The printing of the cream solder 7d is conducted when the busbar is formed. The fastener 2 is inserted in the through-hole of the busbar 1 and a through-hole formed in the printed circuit board 6 so that the flange 2b is engaged with one surface side of the busbar 1. Then, a caulking operation is conducted to the fastener 2 so that a radial extension 2a is formed at the fastener 2 at the opposite surface side of the printed circuit board 6. Thereafter, the cream solders 7d are molten in the reflow soldering operation in the same manner as the above-mentioned example, whereby the fastener 2 and the land portion 6a are made in one piece. Thus, since the fastener 2 is formed integrally with the busbar 1 and the land portion 6a, the reduction of the thickness of the printed circuit board due to thermal deterioration and the other defects can be prevented.

EXAMPLE 5

Figure 5:
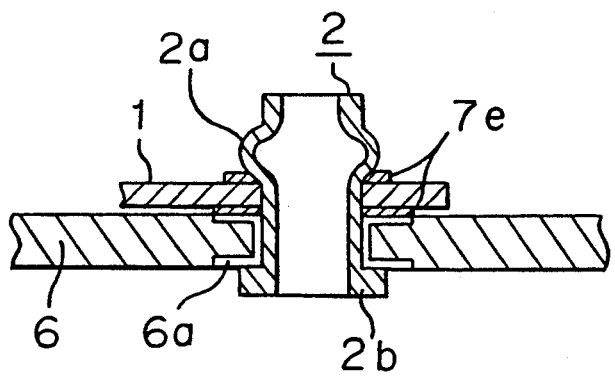
FIG. 5 is a cross-sectional view partly broken of a fifth embodiment of the present invention.

The fifth example of the present invention will be described with reference to FIG. 5. In this example, a cream solder 7c is disposed by printing on the busbar 1 at a position around the through-hole to which the fastener 2 is inserted and is in contact with the radial extension 2a. The printing of the cream solder 7d should be conducted when the busbar 1 is formed. Another cream solder 7d is disposed by printing on the other surface of the busbar 1 so as to face the land portion 6a and in agreement with the diameter of the land portion. The fastener 2 is inserted in a through-hole formed in the printed circuit board 6 and the through-hole of the busbar 1 so that the flange 2b is engaged with a surface of the printed circuit board 6, followed by conducting a caulking operation to the fastener 2. After the radial extension 2a has been formed at the outer side of the busbar 1, the cream solder 7e is molten to thereby make the fastener 2 and the land portion 6 in one piece. In the same manner as the Example 3, the cream solder 7e is molten at the time of conducting the reflow soldering to thereby make the fastener 2, the busbar 1 and the land portion 6a in one piece, whereby the assembling operation can be effective and the reduction of the thickness of the printed circuit board due to thermal deterioration and other defects can be prevented.

In Examples 4 and 5, the cream solder 7e is disposed by printing so as to be in agreement with the diameter of the land portion 6a. However, it is not always necessary to meet the diameter of the land portion, but it is sufficient to dispose the cream solder 7e at at least a part of the busbar 1 which faces the land portion 6a.

EXAMPLE 6

Figure 6:
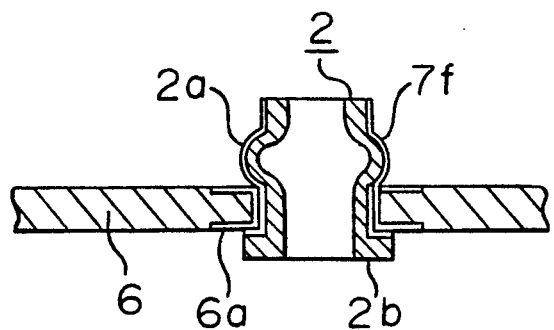
FIG. 6 is a cross-sectional view partly broken of a sixth embodiment of the present invention.

The sixth example of the present invention will be described with reference to FIG. 6. In this Example 6, a solder layer 7f is formed by plating on the fastener 2 when the fastener 2 is prepared. The fastener 2 is inserted in a through-hole of the printed circuit board 6 so that the flange 2b of the fastener is engaged with a surface of the printed circuit board 6. A caulking operation is conducted to the fastener 2 so that a radial extension 2a is formed at the fastener 2 at the opposite surface side of the printed circuit board 6. After the fastener 2 has been caulked, the fastener 2 and the land portion 6a are soldered to connect them in one piece at the flow soldering step. In this Example, since the fastener 2 and the land portion 6a is connected in one piece, the reduction of the thickness of the printed circuit board due to thermal deterioration and the defects can be prevented.

In accordance with the method according to the first embodiment comprising a step of inserting a fastener with a bottom flange in a through-hole formed in a printed circuit board so that the bottom flange is engaged with a surface of the printed circuit board, a step of putting a washer having substantially the same outer diameter as the flange around the fastener at the other surface of the circuit board, a step of forming a radial extension at the outer side of the washer by caulking the fastener, whereby the fastener is fixed to the printed circuit board by means of the radial extension and the flange, there is obtainable a method of preparing a large-current printed circuit board which prevents the occurrence of a curve in the printed circuit board which is caused when the fastener is caulked to fix it to the printed board; which provides a flat surface of contact when the fastener is fixed to the printed circuit board, and which provides a uniform fitting strength of the fastener to the printed circuit board.

According to another method in accordance with the first embodiment comprising a step of inserting a fastener with a bottom flange in through-holes formed in a printed circuit board and a busbar so that the bottom flange is engaged with a surface of the circuit board, a step of putting a washer having substantially the same outer diameter as the flange around the fastener at the other surface of the circuit board, a step of forming a radial extension at the outer side of the washer by caulking the fastener whereby the fastener is fixed to the printed circuit board and the busbar by means of the radial extension and the flange, a method of preparing a large-current printed circuit board having the same effect as in the first invention can be obtained.

Further, according to the method of the second embodiment a fastener is inserted into a through-hole formed in a printed circuit board so that the flange is engaged with a surface of the printed circuit board through a spring washer in addition to the steps as described in the first embodiment. Accordingly, there is obtainable a method of preparing a large-current printed circuit board which suppresses the weakening of the fitting strength between the fastener and the printed circuit board by the aid of a spring function even when thermal deterioration is caused in the printed circuit board. Further, the advantages as described with reference to the first embodiment are also obtainable.

Further, according to the method of the third embodiment comprising putting a cream solder by a printing technique at at least a part of a land portion of a printed circuit board, inserting a fastener with a bottom flange in a through-hole formed in the printed circuit board so that the bottom flange is engaged with a surface of the circuit board, forming a radial extension at the other side of the printed circuit board by caulking the fastener, and melting the cream solder whereby the fastener is fixed to the printed circuit board, there is obtainable a method of preparing a large-current printed circuit board capable of forming the printed circuit board and the fastener in one piece and of eliminating defects due to the thermal deterioration.

According to the method of the fourth embodiment comprising putting a cream solder by a printing technique at a portion of a side of the busbar, the portion being brought into contact with a bottom flange formed at the fastener, putting another cream solder by a printing technique at a portion facing a land portion of a printed circuit board, inserting the fastener in through-holes formed in the printed circuit board and the busbar so that the bottom flange of the fastener is engaged with a surface of the printed circuit board, forming a radial extension at the other side of the printed circuit board by caulking the fastener and melting the cream solders whereby the fastener is fixed to the printed circuit board and the busbar, there is obtainable a method of preparing a large-current printed circuit board capable of forming the printed circuit board and the fastener in one piece and capable of eliminating defects caused by the thermal deterioration.

According to the method of the fifth embodiment comprising putting a cream solder by a printing technique at a portion of a surface of a busbar, the portion being brought into contact with a radial extension formed at a fastener, putting another the cream solder by printing at a portion facing a land portion of a printed circuit board, inserting the fastener in through-holes formed in the printed circuit board and the busbar so that the bottom flange of the fastener is engaged with a surface of the printed circuit board, forming the radial extension at the outer surface of the busbar by caulking the fastener, and melting the cream solders whereby the fastener is fixed to the printed circuit board and the busbar, there is obtainable a method of preparing a large-current printed circuit board capable of forming the printed circuit board and the fastener in one piece and of eliminating defects caused by the thermal deterioration.

According to the method of the sixth embodiment comprising forming a solder layer by plating at an outer surface of a fastener with a bottom flange, inserting the fastener in a through-hole formed in a printed circuit board so that the bottom flange of the fastener is engaged with a surface of the printed circuit board, forming a radial extension at the outer side of the printed circuit board by caulking the fastener, and soldering the fastener and a land portion of the printed circuit board whereby the fastener is fixed to the circuit board, there is obtainable a method of preparing a large-current printed circuit board capable of forming the printed circuit board and the fastener in one piece and of eliminating defects caused by the thermal deterioration.

Obviously, numerous modifications and variations of the present invention are possible in light of the above teachings. It is therefore to be understood that within the scope of the appended claims, the invention may be practiced otherwise than as specifically described herein.

What is claimed is:

1. A method of preparing a large-current printed circuit board which comprises:
    inserting a fastener with a bottom flange in a through-hole formed in a printed circuit board so that the bottom flange is at one side of the printed circuit board,
    putting a washer having substantially the same outer diameter as said flange around the fastener at the other side of the board, the washer and the flange applying uniform pressure to the printed circuit board when a caulking operation for fixing the fastener is conducted, and
    forming a radial extension on the fastener at an outer side of the washer by caulking the fastener, whereby the fastener is fixed to the printed circuit board by means of the radial extension and the bottom flange, the washer being interposed between the radial extension and the printed circuit board.

2. A method of preparing a large-current printed circuit board which comprises:
    inserting a fastener with a bottom flange in through-holes formed in a printed circuit board and a busbar so that the bottom flange faces one side of the printed circuit board and busbar,
    putting a washer having substantially the same outer diameter as said flange around the fastener at the other side of the busbar and printed circuit board, whereby a uniform pressure is applied to the printed circuit board by the washer and the flange when a caulking operation for fixing the fastener is conducted, and
    forming a radial extension on the fastener at an outer side of the washer by caulking the fastener, whereby the fastener is fixed to the printed circuit board and the busbar by means of the radial extension and the bottom flange, the washer being interposed between the radial extension and the printed circuit board.

3. A method of preparing a large-current printed circuit board comprising:
    inserting a fastener with a bottom flange in a through-hole formed in a printed circuit board so that the bottom flange is at one side of the printed circuit board,
    putting a spring washer around the fastener and against the printed circuit board, wherein said spring washer expands when the thickness of the printed circuit board is reduced by thermal deterioration, and
    forming a radial extension on the fastener at an outer side of the washer by caulking the fastener, whereby the fastener is fixed to the printed circuit board by means of the radial extension and the bottom flange.

4. A method of preparing a large-current printed circuit board, comprising:
    inserting a fastener with a bottom flange in through-holes formed in a printed circuit board and a busbar so that the bottom flange faces one side of the printed circuit board and busbar,
    putting a spring washer around the fastener and against the printed circuit and busbar,
    wherein said spring washer expands when the thickness of the printed circuit board is reduced by thermal deterioration, and forming a radial extension on the fastener at an outer side of the washer by caulking the fastener, whereby the fastener is fixed to the printed circuit board and the busbar by means of the radial extension and the bottom flange.

* * * * *